United States Patent
Yang

(10) Patent No.: US 7,817,289 B2
(45) Date of Patent: Oct. 19, 2010

(54) METHODS AND APPARATUS FOR MEASURING THICKNESS OF ETCHING RESIDUES ON A SUBSTRATE

(75) Inventor: Susie Xiuru Yang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 275 days.

(21) Appl. No.: 12/178,567

(22) Filed: Jul. 23, 2008

(65) Prior Publication Data

US 2009/0027695 A1 Jan. 29, 2009

Related U.S. Application Data

(60) Provisional application No. 60/951,444, filed on Jul. 23, 2007.

(51) Int. Cl.
*G01B 11/28* (2006.01)
(52) U.S. Cl. .................................................... 356/630
(58) Field of Classification Search ............ 56/600–640
See application file for complete search history.

(56) References Cited

U.S. PATENT DOCUMENTS 4,454,001 A * 6/1984 Sternheim et al. ............. 216/60
5,392,124 A * 2/1995 Barbee et al. ............... 356/632
5,450,205 A * 9/1995 Sawin et al. ................ 356/632
2005/0014299 A1* 1/2005 Yang et al. .................... 438/16

FOREIGN PATENT DOCUMENTS

WO    WO 2009/014698 A1    1/2009

OTHER PUBLICATIONS

International Search Report and Written Opinion of International Application No. PCT/US08/08906 mailed Sep. 29, 2008.
Thony et al., "Evaluation of Scatterometry Tools for Integrated Metrology", ST Microelectronics, entire document http://www.imec.be/uv2litho/SEMI03.pdj, Nov. 30, 2004.

* cited by examiner

*Primary Examiner*—Gregory J Toatley, Jr.
*Assistant Examiner*—Jarreas C. Underwood
(74) *Attorney, Agent, or Firm*—Dugan & Dugan

(57) ABSTRACT

A method of determining a thickness of a residue layer on a substrate includes: (1) taking a first set of optical scatterometry measurements on the substrate after an etching procedure; (2) taking a second set of optical scatterometry measurements on the substrate after a post-etch cleaning procedure; (3) calculating a difference measurement between the first set and second set of optical scatterometry measurements; (4) determining an initial thickness measurement of the residue layer based on the difference measurement by applying a first dispersion model; and (5) adjusting the initial thickness measurement by applying a second dispersion model based on a material composition of the residue layer. Numerous other aspects are provided.

13 Claims, 2 Drawing Sheets

METHODS AND APPARATUS FOR MEASURING THICKNESS OF ETCHING RESIDUES ON A SUBSTRATE

The present application claims priority from U.S. Provisional Patent Application Ser. No. 60/951,444, filed Jul. 23, 2007, which is hereby incorporated by reference herein in its entirety for all purposes.

FIELD OF THE INVENTION

The present invention relates to electronic device manufacturing, and more particularly to methods and apparatus for measuring the thickness of etching residues on a substrate.

BACKGROUND OF THE INVENTION

As a substrate is etched in the process of manufacturing electronic devices, thin layers of post-etching residue such as polymers or other by-products may be formed on the substrate. It is useful to know the thickness of such layers in order to optimize the etching process.

Accordingly, methods and apparatus for accurately and cost-effectively measuring the thickness of layers of post-etching residues on a substrate are desired.

SUMMARY OF THE INVENTION

In a first aspect of the invention, a method of determining a thickness of a residue layer on substrate is provided that includes (1) performing a first set of optical scatterometry measurements on the substrate after an etching procedure; (2) performing a second set of optical scatterometry measurements on the substrate after a post-etch cleaning procedure; (3) calculating a difference measurement between the first set and second set of optical scatterometry measurements; and (4) determining an initial thickness measurement of the residue layer based on the difference measurement by applying a first dispersion model.

In a second aspect of the invention, a method of determining a thickness of a residue layer on substrate is provided that includes (1) performing a first set of optical scatterometry measurements on the substrate after an etching procedure; (2) performing a second set of optical scatterometry measurements on the substrate after a post-etch cleaning procedure; (3) calculating a difference measurement between the first set and second set of optical scatterometry measurements; (4) determining an initial thickness measurement of the residue layer based on the difference measurement by applying a first dispersion model; and (5) adjusting the initial thickness measurement by applying a second dispersion model based on a material composition of the residue layer.

In a third aspect of the invention, a method of determining a thickness of a residue layer on substrate is provided that includes (1) performing a first set of optical scatterometry measurements on the substrate after an etching procedure; (2) performing a second set of optical scatterometry measurements on the substrate after a post-etch cleaning procedure; (3) calculating a difference measurement between the first set and second set of optical scatterometry measurements; (4) determining an initial thickness measurement of the residue layer based on the difference measurement by applying a first dispersion model; and (5) adjusting the initial thickness measurement by applying a second dispersion model based on a material composition of the residue layer. The first dispersion model comprises a silicon dioxide optical dispersion model. The second dispersion model comprises at least one of an organic material dispersion model and a dielectric dispersion model.

Other features and aspects of the present invention will become more fully apparent from the following detailed description, the appended claim and the accompanying drawings.

DETAILED DESCRIPTION

The continual reduction of feature sizes in electronic device manufacturing causes the need for advanced high-resolution metrology techniques to measure critical dimensions and profiles of the smaller-sized features. Conventional techniques, including scanning electron microscopy (SEM), may not provide accurate enough measurements or aid in the characterization of certain features. For example, during plasma etching procedures used in the fabrication of dense arrays (e.g., grating arrays) such as shallow trench isolation (STI) or damascene trenches, a polymeric compound and/or other residues may be deposited on the sidewalls of trenches of the arrays. Precise knowledge of the thickness and shape of such residues (hereinafter referred to as a residue layer for ease of reference), may be useful in adjusting and/or optimizing the plasma etching process and/or post-etch cleaning processes.

According to the present invention, critical dimensions and/or profiles of semiconductor device features, including plasma etch residue layers, are measured using optical scatterometry. In spectroscopic scatterometry, which may include the techniques of spectroscopic reflectometry and ellipsometry, light of various wavelengths is directed onto a dense array at one or more angles of incidence. The interaction of light reflection, diffraction and refraction striking the array produces changes in intensity and phase or polarization state (which may vary by angle of incidence and/or wavelength) that can be measured and then input to a mathematical model (e.g., using a dispersion model, rigorous coupled wave analysis (RCWA), etc.) to reconstruct a profile shape of features of the array.

According to one embodiment of the invention, the thickness at one or more points in the profile of a residue layer on an etched feature may be determined by: (1) performing a first set of optical scatterometry measurements after etching of the feature; (2) performing a second set of optical scatterometry measurements after a cleaning which removes at least a substantial portion of the residue layer from the etched feature; (3) calculating a difference measurement (D) between the first set and second set of optical scatterometry measurements; (4) determining an initial thickness measurement of the residue layer based on the difference measurement by applying a first dispersion model where the difference indicates properties of the layer that has been removed; and (5) adjusting the initial thickness measurement by applying a second dispersion model based on the material composition of the residue layer.

Figure 1A:
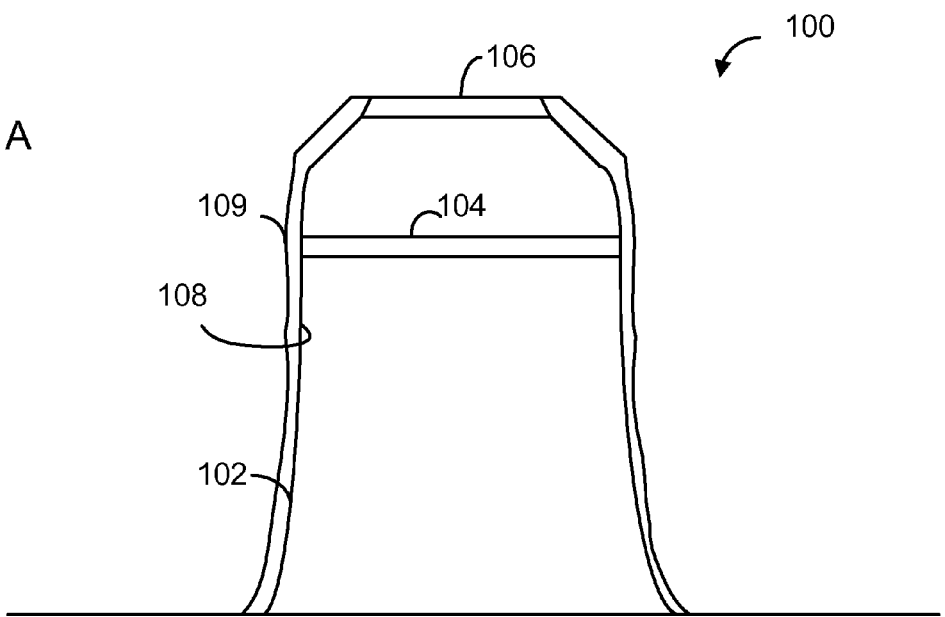
FIG. 1A is a cross-sectional view of an exemplary dense array line profile including a residue layer.

FIG. 1A shows a cross-sectional profile of an exemplary line 100 in a dense array after an etching (e.g., plasma etching) process. The line 100 may include a plurality of stacked layers 102, 104, 106 having sidewalls 108. In one or more embodiments, layer 102 may comprise silicon, layer 104 positioned above layer 102 may comprise a thin oxide layer, and layer 106 positioned above layer 104 may comprise silicon nitride. Other numbers and/or types of layers may be used. As shown, the widths of the layers 102, 106 may decrease to some extent with height, producing a tapered and/or trapezoidal profile, although this is merely exemplary and other lines may have other shapes. For example the width of layer 102 may taper from about 200 nm to about 150 nm, and the width of layer 106 may taper from about 150 nm to about 100 nm.

A residue layer 109 may be deposited on the sidewalls 108 of the line 100 during an etching procedure. The thickness of the residue layer 109 may vary to some extent along the vertical height of the sidewalls 108 and, in some embodiments, may range from about 10 to about 30 nm. The residual layer 109 may have other thicknesses however.

Figure 1B:
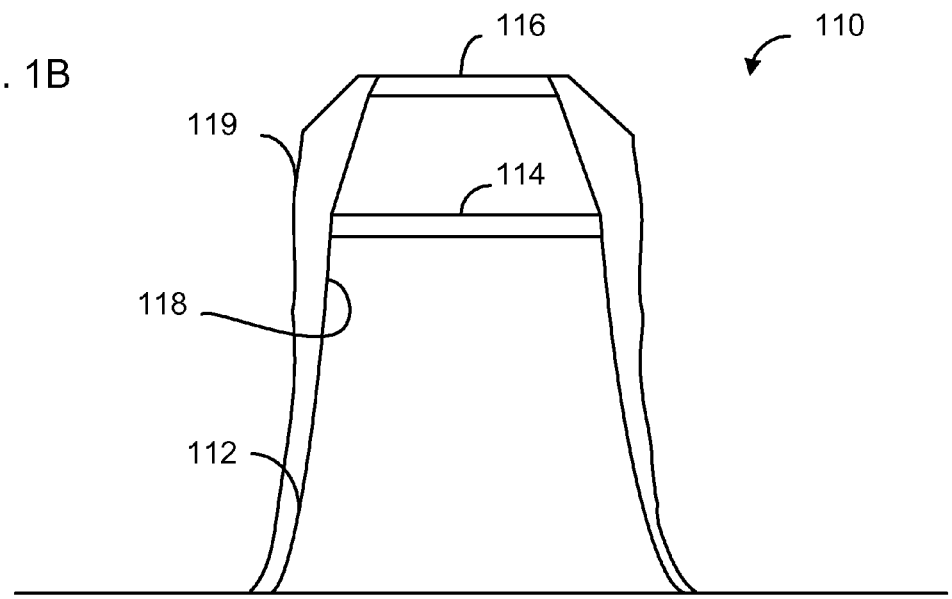
FIG. 1B is a cross-sectional view of another exemplary dense array line profile including a residue layer.

FIG. 1B shows a similar cross-sectional profile of another exemplary line 110 having layers 112, 114, 116, sidewalls 118 and residue layer 119. As can be discerned, the profile of line 110 varies from the profile of line 100 with the sidewalls 118 of line 110 being sloped at a greater angle with respect to the vertical axis of the line 110. A thicker residue layer is also present.

Figure 2:
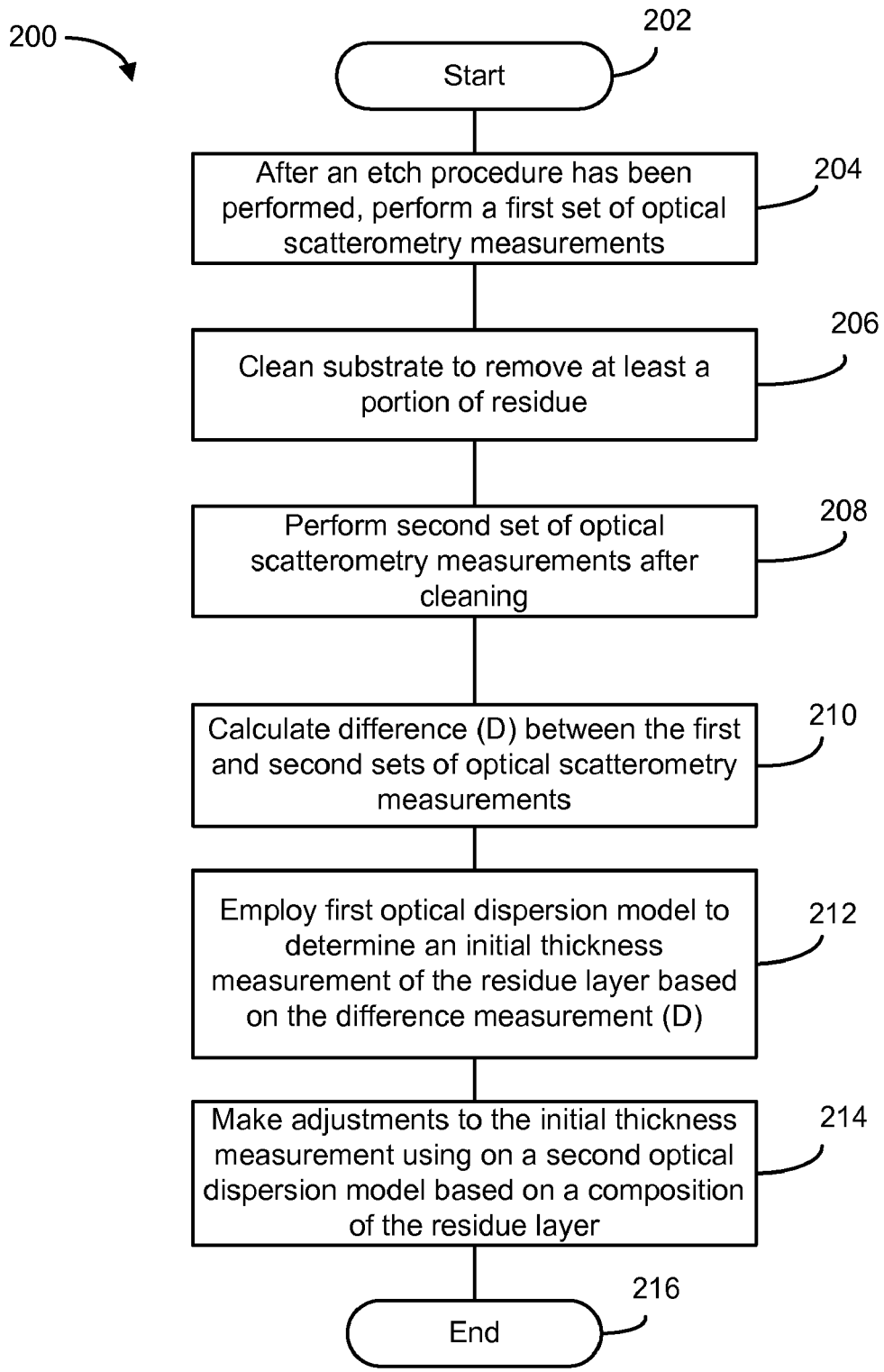
FIG. 2 is a flow chart of an exemplary method of determining the thickness of a residue layer according to an embodiment of the present invention.

FIG. 2 is a flow chart of an exemplary method 200 for determining the profile (e.g., including thickness information) of a residue layer (e.g., residue layer 109) formed on a substrate by an etching process. In step 202 the method 200 begins. In step 204, after an etching procedure has been performed on the substrate, a first set of optical scatterometry measurements is taken. For example, incident light may be directed upon features of the substrate, such as trenches, lines, etc. The incident light undergoes reflection, refraction, diffraction and/or a combination thereof, thereby scattering at a variety of angles with respect to the light's angle(s) of incidence. The scattered light reaches a detector at which an intensity, phase and/or a polarization state of the light may be measured. The detected intensity, phase and/or polarization data may be acquired versus wavelength and angle of incidence, for example. Exemplary parameters that may be measured using optical scatterometry include critical dimension, trench width, trench profile, and the like. Any suitable optical scatterometry measurement tool may be employed.

In one exemplary embodiment, an etching process may be used to form the line 100, employing a silicon nitride/silicon dioxide hard mask (e.g., layers 106 and 104 for example). A $Cl_2/O_2$ etch process may be employed to etch any BARC layer (not shown), and an $SF_6/CHF_3/O_2$ etch process may be employed to etch the hard mask (e.g., layers 106 and/or 104) and to expose the underlying silicon substrate. Thereafter, a $Cl_2/O_2$ etch process may be employed to etch the silicon substrate so as to form the line 100 (e.g., by forming trenches on either side of the line 100). Other etch processes and/or chemistries may be used.

After the first set of optical scatterometry measurements are taken after the etching procedure, the substrate is cleaned in step 206, presumably removing at least a substantial portion of any residue layer formed on the substrate (e.g., residue layer 109). A cleaning tool (not shown), for example, may clean the substrate using conventional cleaning techniques. For example, one or more wet cleaning techniques may be used that employ dilute hydrofluoric acid, Marangoni drying, megasonic cleaning, etc., to remove the residue layer 109 from the substrate.

In step 208, a second set of optical scatterometry measurements is performed on the substrate. Exemplary parameters that may be measured using optical scatterometry include critical dimension, trench width, trench profile, and the like. In step 210, a difference (D) between the first and second set of optical scatterometry measurements is calculated. The difference (D) is indicative of the affect any residue layer has on the optical scatterometry results, which is related to the thickness of any residue layer. In step 212, a first optical dispersion model may be employed to determine initial characteristics of features on the substrate, including, for example, residue layer thickness and/or profile, based on the difference measurements (D). According to some embodiments, the first optical dispersion model may be based on a silicon dioxide dispersion model. For example, a silicon dioxide dispersion model may be employed to generate a first order approximation of residue layer characteristics such as thickness and/or profile because of the relatively well-known optical characteristics of silicon dioxide.

In step 214, adjustments are made to the initial residue characteristic measurements (e.g., residue layer 109 thickness) using a second optical dispersion model. The second optical dispersion model is preferably based on the material composition of the residue layer present on the substrate after etching. The residue layer may include, for example, polymeric (e.g., organic) material produced and/or used during the plasma etching process, residual dielectric material (e.g., SiO, SiN, etc.) dislodged during etching, or a combination thereof (and possibly other materials). The second optical dispersion model is therefore preferably an organic material dispersion model, a suitable dielectric dispersion model, or some combination or blend of such dispersion models. In one or more embodiments, the result of the second optical dispersion model may be used to adjust the initial residue characteristic measurement values based on the composition of the residue layer. In step 216 the method 200 ends.

The foregoing description discloses only exemplary embodiments of the invention. Modifications of the above disclosed apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claim.

The invention claimed is:

1. A method of determining a thickness of a residue layer on a substrate comprising:

performing a first set of optical scatterometry measurements on the substrate after an etching procedure;

performing a second set of optical scatterometry measurements on the substrate after a post-etch cleaning procedure;

calculating a difference measurement between the first set and second set of optical scatterometry measurements; and determining an initial thickness measurement of the residue layer based on the difference measurement by applying a first dispersion model.

2. The method of claim 1, wherein the first dispersion model comprises a silicon dioxide optical dispersion model.

3. The method of claim 1 wherein the first set of optical scatterometry measurements measures at least one of critical dimension, trench width and trench profile.

4. The method of claim 3 wherein the second set of optical scatterometry measurements measures at least one of critical dimension, trench width and trench profile.

5. The method of claim 1 wherein the first and second sets of optical scatterometry measurements measure at least one of intensity, phase and polarization of light scattered from the substrate.

6. A method of determining a thickness of a residue layer on a substrate comprising:
performing a first set of optical scatterometry measurements on the substrate after an etching procedure;
performing a second set of optical scatterometry measurements on the substrate after a post-etch cleaning procedure;
calculating a difference measurement between the first set and second set of optical scatterometry measurements;
determining an initial thickness measurement of the residue layer based on the difference measurement by applying a first dispersion model; and
adjusting the initial thickness measurement by applying a second dispersion model based on a material composition of the residue layer.

7. The method of claim 6, wherein the first dispersion model comprises a silicon dioxide optical dispersion model.

8. The method of claim 6, wherein the second dispersion model comprises at least one of an organic material dispersion model and a dielectric dispersion model.

9. The method of claim 6 wherein the first set of optical scatterometry measurements measures at least one of critical dimension, trench width and trench profile.

10. The method of claim 9 wherein the second set of optical scatterometry measurements measures at least one of critical dimension, trench width and trench profile.

11. The method of claim 6 wherein the first and second sets of optical scatterometry measurements measure at least one of intensity, phase and polarization of light scattered from the substrate.

12. A method of determining a thickness of a residue layer on a substrate comprising:
performing a first set of optical scatterometry measurements on the substrate after an etching procedure;
performing a second set of optical scatterometry measurements on the substrate after a post-etch cleaning procedure;
calculating a difference measurement between the first set and second set of optical scatterometry measurements;
determining an initial thickness measurement of the residue layer based on the difference measurement by applying a first dispersion model; and
adjusting the initial thickness measurement by applying a second dispersion model based on a material composition of the residue layer;
wherein the first dispersion model comprises a silicon dioxide optical dispersion model; and
wherein the second dispersion model comprises at least one of an organic material dispersion model and a dielectric dispersion model.

13. The method of claim 12 wherein the first and second sets of optical scatterometry measurements measure at least one of intensity, phase and polarization of light scattered from the substrate.

* * * * *